United States Patent [19]

Lillis et al.

[11] Patent Number: 4,893,091
[45] Date of Patent: Jan. 9, 1990

[54] COMPLEMENTARY CURRENT MIRROR FOR CORRECTING INPUT OFFSET VOLTAGE OF DIAMOND FOLLOWER, ESPECIALLY AS INPUT STAGE FOR WIDE-BAND AMPLIFIER

[75] Inventors: William J. Lillis; Anthony D. Wang, both of Tucson, Ariz.

[73] Assignee: Burr-Brown Corporation, Tucson, Ariz.

[21] Appl. No.: 255,774

[22] Filed: Oct. 11, 1988

[51] Int. Cl.⁴ .......................... H03F 3/45; H03F 3/30
[52] U.S. Cl. .................................... 330/253; 330/264; 330/268; 330/288
[58] Field of Search ............... 330/261, 267, 268, 288, 330/299, 253, 264, 269, 277; 323/315, 316

[56] References Cited

U.S. PATENT DOCUMENTS

| T934,009 | 5/1975 | Sheng ............................... 330/288 X |
| 4,325,019 | 4/1982 | Tezuka ................................ 323/315 |
| 4,502,020 | 2/1985 | Nelson et al. .................... 330/267 X |
| 4,540,950 | 9/1985 | Ross .................................... 330/267 |
| 4,540,951 | 9/1985 | Ozawa et al. ...................... 330/267 |
| 4,639,685 | 1/1987 | Saller et al. ......................... 330/263 |

FOREIGN PATENT DOCUMENTS 083911  5/1982  Japan ................................... 323/315
2121633 12/1983 United Kingdom ............... 330/267

Primary Examiner—James B. Mullins
Attorney, Agent, or Firm—Cahill, Sutton & Thomas

[57] ABSTRACT

A complementary current mirror includes a PNP transistor and an NPN transistor, one of which serves as a control transistor and the other of which serves as an output transistor. A $V_{BE}$ voltage generated by forcing a control current into or out of the emitter of the control transistor is imposed between the base and emitter of the output transistor to produce a controlled current in the collector of the output transistor. A first such current mirror, with an NPN control transistor, and a second such current mirror, with a PNP control transistor, are driven by the same control current to supply first and second input bias currents to a diamond follower circuit in the same integrated circuit as the first and second current mirror circuits to face the $V_{BE}$ voltage of the PNP and NPN transistors of the diamond follower circuit to be equal despite variation in saturation currents of the PNP and NPN transistsors. This results in zero input offset for the diamond follower circuit.

17 Claims, 2 Drawing Sheets

COMPLEMENTARY CURRENT MIRROR FOR CORRECTING INPUT OFFSET VOLTAGE OF DIAMOND FOLLOWER, ESPECIALLY AS INPUT STAGE FOR WIDE-BAND AMPLIFIER

BACKGROUND OF THE INVENTION

A commonly used circuit structure is a "diamond follower". The diamond follower can be used as a differential input stage of a wide-band amplifier. FIG. 1 shows the basic diamond follower circuit. To use the diamond follower as a differential input stage, the collectors of transistors 6 and 8 are connected to complementary inputs of a push-pull output stage. When the diamond follower is used as in a differential input stage, terminal 2 of FIG. 1 is used as the $+V_{IN}$ terminal and terminal 3 is used as the $-V_{IN}$ terminal. It is well known that it is very desirable that a differential amplifier have a zero "input offset voltage". That is, when the amplifier output voltage is zero, the voltage difference between the differential input terminals also is zero. However, obtaining a zero input offset voltage for the diamond follower is difficult, because the base-to-emitter voltages ($V_{BE}$'s) all need to be equal if the input offset voltage $V_{OS}$ is to be zero. The transistor $V_{BE}$'s are determined by the equation $V_{BE}=V_{TH}\ln(I_C/I_S)$, where $V_{TH}=(kT/q)$, and k is Boltzman's constant, T is the junction temperature in degrees Kelvin, q is the electron charge, $I_C$ is collector current, and $I_S$ is saturation current. In a typical integrated circuit process, the NPN transistors such as 6 and 7 are fabricated using different critical processing steps from those used to construct the PNP transistors 5 and 8. In some cases the NPN transistors may be "vertical" devices while the PNP transistors may be "lateral" or "vertical" PNP devices. The "saturation current" of a transistor is a strong function of various processing parameters, including the doping levels on both sides of the emitter-base junction. The emitter-base junctions of the NPN transistors 6 and 7 are formed during entirely different process steps than the process steps forming the emitter-base junction of the PNP transistors 5 and 8. The saturation currents of the NPN transistors 6 and 7 are strongly dependent on the diffusion parameters of the N++ emitter diffusion, and the saturation currents of the PNP transistors 5 and 8 are unrelated to the N++ emitter diffusions. The contact potentials are inherently different for NPN transistors and PNP transistors because the contact potentials are a strong function of the saturation currents. This inherent difference in the contact potentials for NPN and PNP transistors results in inherent, large, somewhat uncontrollable variations in the input offset voltage of the diamond follower circuit of FIG. 1 when it is used as a differential input stage of an amplifier.

A known solution to the problem is to add diode-connected NPN transistors or PNP transistors in series with transistors 5, 6, 7, and 8 so that each NPN transistor emitter-base junction is always connected in series with a corresponding PNP transistor emitter-base junction. These solutions increase the amount of integrated circuit chip area required to implement an amplifier, and have a detrimental effect on circuit performance by adding noise and capacitance that usually results in poor frequency response for the amplifier.

There is a presently unmet need for a simple technique for reducing the input offset voltage of a diamond follower.

There is a presently unmet need for a simple technique for reducing the input offset voltage of an amplifier using a diamond follower as a differential input stage.

A wide variety of current mirror circuits are known. None of them have ever been utilized to compensate for input offset errors in a diamond follower stage used as a differential input stage of an amplifier.

SUMMARY OF THE INVENTION

Accordingly, it is an object of the invention to provide a complementary current mirror circuit.

It is another object of the invention to provide a simple, inexpensive technique for reducing the offset voltage in a diamond follower circuit.

It is another object of the invention to provide a simple, inexpensive technique for reducing the input offset voltage of an amplifier using a diamond follower circuit as a differential input stage.

Briefly described, and in accordance with one embodiment thereof, the invention provides a complementary current mirror circuit. In the described embodiment of the invention, a pair of complementary current mirrors are used as current sources for a diamond follower circuit stage. In one described embodiment, the complementary current mirror circuits adjust currents through a PNP transistor and an NPN transistor on one side of the diamond follower circuit in such a manner as to force the $V_{BE}$ voltages of those two transistors to equal the $V_{BE}$ voltages of an NPN transistor and a PNP transistor, respectively, on the other side of the diamond follower circuit, thereby providing zero input offset voltage. In another embodiment of the invention, a diamond follower is used as a differential input stage for a wide band amplifier. Bipolar and CMOS implementations of this embodiment are disclosed.

DETAILED DESCRIPTION OF THE PREFERRED EMBODIMENTS

Figure 1:
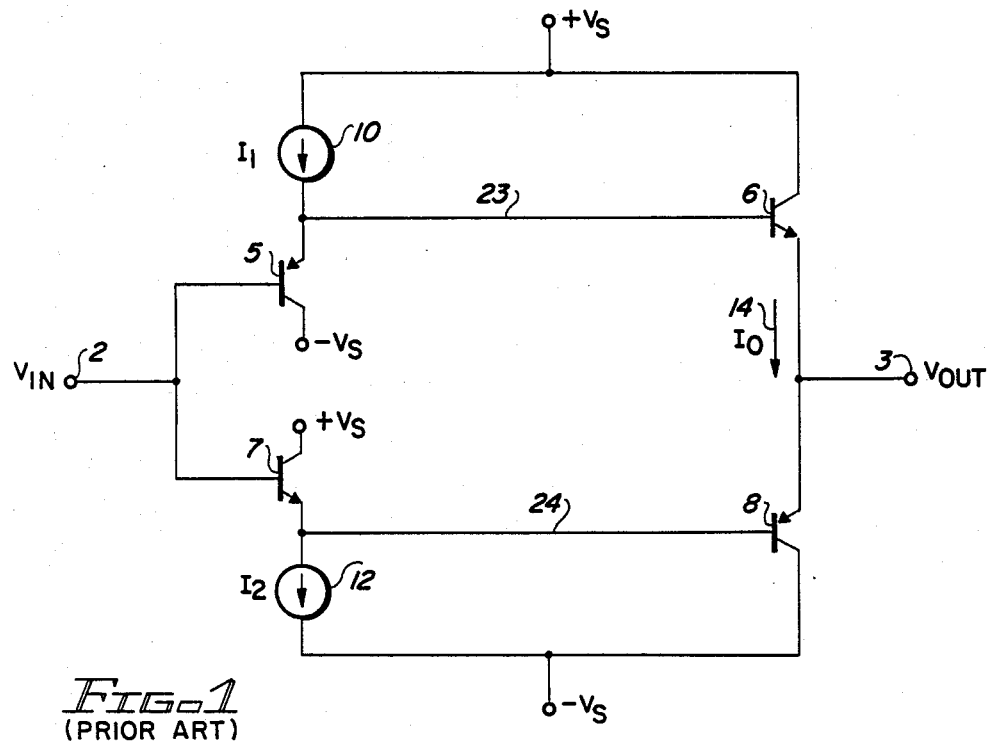
FIG. 1 is a schematic circuit diagram of a diamond follower circuit.
Figure 3:
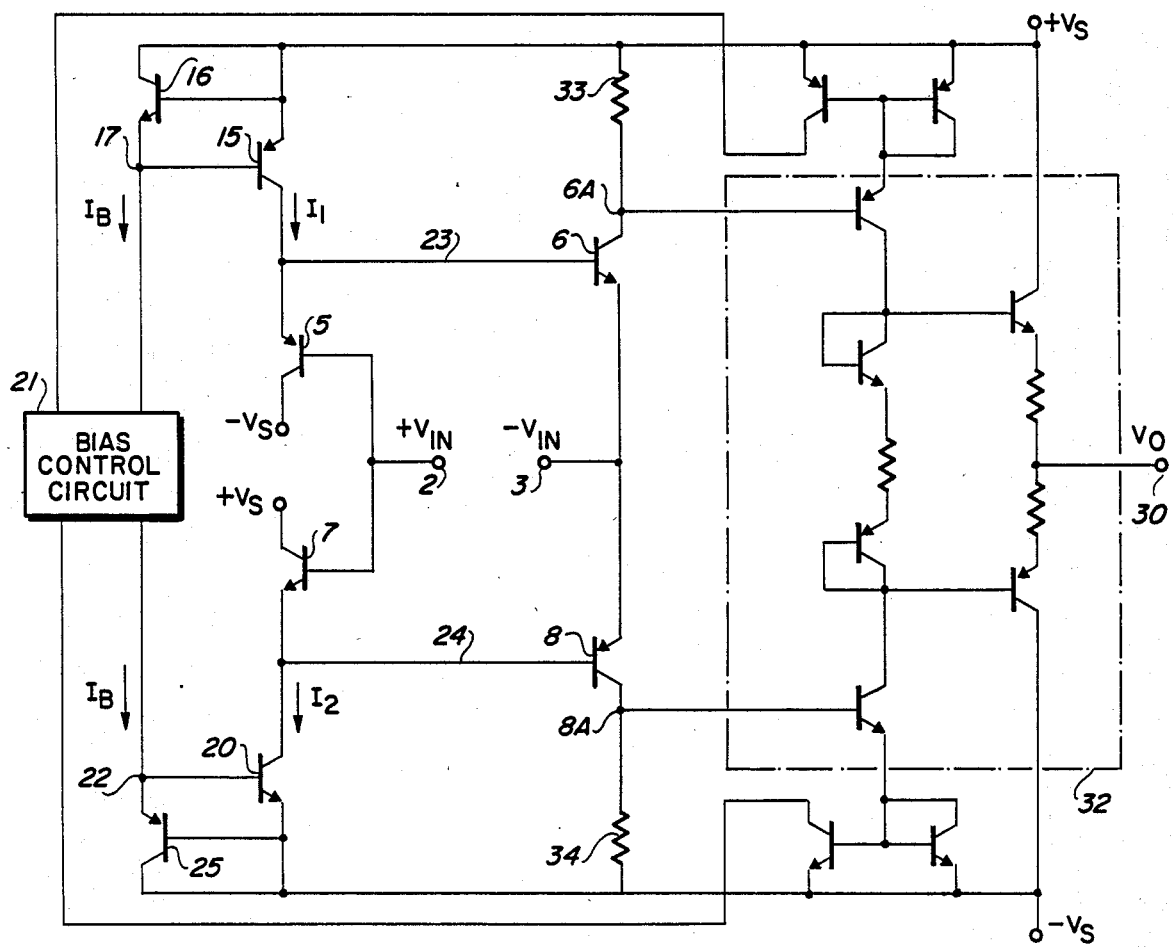
FIG. 3 is a simplified schematic circuit diagram of a wide-band amplifier utilizing the circuit of FIG. 2 as a bias circuit and utilizing a modified diamond follower circuit as a differential input stage.

Referring to FIG. 1, the basic diamond follower structure is shown. It includes a constant current source 10 through which a current $I_1$ flows. Current source 10 is connected between $+V_S$ and conductor 23, which is connected to the base of NPN transistor 6 and the emitter of PNP transistor 5. The collector of transistor 6 is connected to $+V_S$ (although when the diamond follower circuit is used as a differential input stage of an amplifier, the collector of transistor 6 is connected to one input of a gain and output stage of the amplifier, and the collector of transistor 8 is connected to another input of the gain and output stage, as shown in FIG. 3). The collector of transistor 5 is connected to $-V_S$, and its base is connected to conductor 2. Conductor 2 is also connected to the base of NPN transistor 7, the collector of which is connected to $+V_S$. The emitter of transistor 7 is connected by conductor 24 to constant current source 12, through which a current $I_2$ flows to $-V_S$. Conductor 24 also is connected to the base of PNP transistor 8, the collector of which is connected to $-V_S$. The emitter of transistor 6 and the emitter of transistor 8 are both connected to conductor 3. In FIG. 1, the emitter areas of transistors 6 and 8 are k times those of transistors 5 and 7.

It can be readily seen that the voltage between conductors 23 and 24 is equal to (1) $V_{BE5}+V_{BE7}$ and (2) $V_{BE6}+V_{BE8}$. It also can be readily seen that the offset voltage $V_{OS}$ is equal to $V_{IN}$ minus $V_{OUT}$ and that this is equal to either (1) $V_{BE6}-V_{BE5}$ or (2) $V_{BE7}-V_{BE8}$. Thus, the input offset voltages will be zero only if the $V_{BE}$ voltages of NPN transistors 6 and 7 is equal to that of the PNP transistors 5 and 8. As mentioned above, this often is not the case for monolithic integrated circuit implementations of the circuit.

Figures 2, 4:
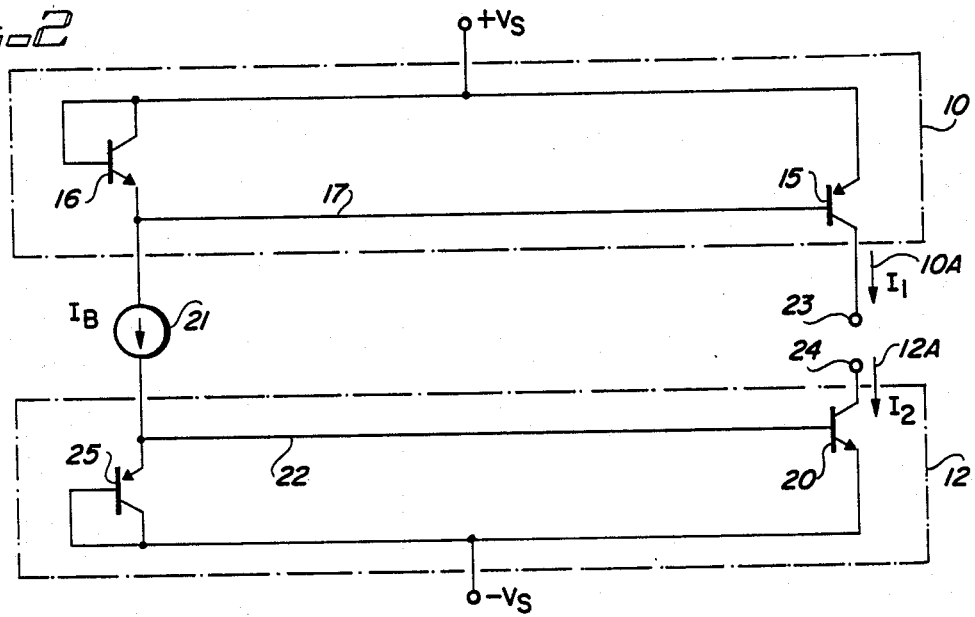
FIG. 2 is a schematic diagram illustrating a bias circuit including a pair of complementary current mirror circuits.
FIG. 4 is a schematic diagram of a wide-band amplifier similar to that of FIG. 3 implemented using complementary field effect transistors.

In FIG. 2, the circuit is shown including a bias current source 21 producing a constant current $I_B$ which functions as a control current for a complementary current mirror circuit 10 and another complementary current mirror circuit 12 which, in accordance, with the present invention, can be used to implement current sources 10 and 12 in the diamond follower circuit of FIG. 1. Complementary current mirror circuit 10 includes a NPN transistor 16 having its collector and base connected to $+V_S$ and its emitter connected to conductor 17 and to bias current circuit 21. Conductor 17 also is connected to the base of PNP transistor 15, which has its emitter connected to $+V_S$ and its collector connected to conductor 23. The current $I_1$ flows through transistor 15, as indicated by arrow 10A. Complementary current mirror circuit 12 includes diode-connected PNP transistor 25, which has its collector and base connected to $-V_S$ and its emitter connected by conductor 22 to bias current source 21 and to the base of NPN transistor 20. The emitter of transistor 20 is connected to $-V_S$ and its collector is connected to conductor 24. The current $I_2$ flows through transistor 20, as indicated by arrow 12A.

In accordance with the present invention, the bias circuit of FIG. 2 provides currents $I_1$ and $I_2$ with amplitudes that vary as a function of the saturation currents $I_S$ for the NPN transistors and PNP transistors in such a manner that the value of $I_1$ flowing through PNP transistor 5 causes its $V_{BE}$ voltage to be equal to that of NPN transistor 6 even though their contact potentials and normalized saturation currents are different. The circuit of FIG. 2 also causes $I_2$ to have a value that causes the $V_{BE}$ voltage of NPN transistor 7 to be equal to the $V_{BE}$ voltage of PNP transistor 8, even though their contact potentials and normalized saturation currents are different as a result of processing parameter variations.

The following analysis, including equations (1) through (12) for the circuit of FIG. 1 establishes the requirements for $I_1$ and $I_2$ if the $V_{BE}$ voltages of the PNP transistors and the NPN transistors in FIG. 1 are to be equal despite differences in their saturation currents or contact potentials.

The input offset voltage $V_{OS}$ for the circuit of FIG. 1 is given by equation $$V_{OS}=V_{IN}-V_{OUT} \quad (1)$$

Thus, it can be seen that $V_{OS}$ is given by each of the two following equations $$V_{OS}=V_{BE6}-V_{BE5} \quad (1.1)$$

and $$V_{OS}=V_{BE7}-V_{BE8} \quad (1.2)$$

When $V_{OS}$ is set equal to 0, equation (1.1) leads to equation $$\ln\left(\frac{I_1}{I_{S5}}\right)=\ln\left(\frac{I_0}{I_{S6}}\right), \quad (2)$$

and equation (1.2) leads to equation $$\ln\left(\frac{I_0}{I_{S8}}\right)=\ln\left(\frac{I_2}{I_{S7}}\right). \quad (3)$$

The saturation current $I_S(NPN)$ for NPN transistors and the saturation current $I_S(PNP)$ for PNP transistors are related by the ratio m, which can vary from batch to batch and wafer to wafer in the manufacture of integrated circuits. However, m is usually very uniform across a particular integrated circuit. The following equation relates the saturation currents in the circuit of FIG. 1:

$$m = \frac{I_S(NPN)}{I_S(PNP)} = \frac{I_{S6}}{I_{S8}} = \frac{I_{S7}}{I_{S5}}. \quad (4)$$

Equation (2) leads to equation $$\ln\left(\frac{I_1}{I_{S5}}\right)=\ln\left(\frac{I_0}{mI_{S8}}\right). \quad (5)$$

Equation (3) leads to equation $$\ln\left(\frac{I_0}{I_{S8}}\right)=\ln\left(\frac{I_2}{mI_{S5}}\right). \quad (6)$$

From equation (5), it can be seen that $$I_0 = \frac{I_1 m I_{S8}}{I_{S5}}, \quad (7)$$

and from equation (6), it can be seen that $$I_0 = \frac{I_2 I_{S8}}{m I_{S5}}. \quad (8)$$

Since the emitter area of transistors 6 and 8 is k times that of transistors 7 and 5, it can be seen that from equation (7)

$$I_0=I_1 mk, \quad (9)$$

and from equation (8), it can be seen that $$I_0 = \frac{I_2 k}{m}, \quad (10)$$

Where k is defined to be $I_{S8}$ divided by $I_{S5}$ equations (9) and (10) lead to equations (11) and (12), respectively $$I_1 = \frac{I_0}{mk} \tag{11}$$

Thus, it is seen that for zero offset voltage the diamond follower circuit of FIG. 1 requires current sources 10 and 12 to supply currents $I_1$ and $I_2$ given by equations (11) and (12), respectively, where m is the ratio of saturation currents of NPN transistors and PNP transistors, and k is the ratio between the emitter area of transistors 6 or 8 to that of transistor 7 or 5, respectively.

Equations (13)–(20) show a similar analysis for the current source circuit of FIG. 2. The current $I_1$ flowing through PNP transistor 15 is given by the equation $$I_1 = I_{S15} \exp\left(\frac{V_{BE16}}{V_{TH}}\right) \tag{13}$$

where $I_{S\,15}$ *is a saturation current of transistor 15 and* $V_{BE}$ 16 is the magnitude of the base-to-emitter voltage of NPN transistor 16. Similarly, the equation for the current $I_2$ flowing through NPN transistor 20 is given by equation $$I_2 = I_{S20} \exp\left(\frac{V_{BE25}}{V_{TH}}\right) \tag{14}$$

where $V_{TH}$ is equal to kT divided by q.

The equation for $V_{BE16}$ as a function of $I_B$ is given by equation $$V_{BE16} = V_{TH}\ln\frac{I_B}{I_{S16}}, \tag{15}$$

and the voltage $V_{BE25}$ is given by equation $$V_{BE25} = V_{TH}\ln\frac{I_B}{I_{S25}}, \tag{16}$$

Substituting equation (15) into equation (13) gives equation $$I_1 = \frac{I_B I_{S15}}{I_{S16}}, \tag{17}$$

and substituting equation (16) into equation (14) gives equation $$I_2 = \frac{I_B I_{S20}}{I_{S25}}. \tag{18}$$

Substituting m for the ratio $I_{S16}/I_{S15}$ in equation (17) leads to equation $$I_1 = \frac{I_B}{m} \tag{19}$$

Similarly, substituting m for the ratio $I_{S20}/I_{S25}$ leads to equation $$I_2 = mI_B \tag{20}$$

The above relationships between $I_1$, $I_2$, $I_B$ and m are exactly what is required by the diamond follower circuit of FIG. 1 in order to produce the input offset voltage $V_{OS}$ equal to zero, as explained above. Also, the current $I_0$ is exactly k multiplied by $I_B$.

The following describes a feature of scaling that can be accomplished with the complementary current mirror circuit of FIG. 2. If it is assumed that the emitter areas of transistors 15 and 20 are scaled by a factor x relative to transistors 16 and 25, respectively, i.e., if $I_{S15}=xI_{S25}$ and $I_{S20}=xI_{S16}$, then the analysis of this scaling effect can be understood from the following equations:

$$V_{BE16} = V_{TH}\ln\left(\frac{I_B}{I_{S16}}\right), V_{BE25} = V_{TH}\ln\left(\frac{I_B}{I_{S25}}\right) \tag{21}$$

From equation (21), it can be seen that the output currents $I_1$ and $I_2$ are given by the following equations:

$$I_1 = I_{S15}\exp\left(\frac{V_{BE16}}{V_{TH}}\right) = I_B\frac{I_{S15}}{I_{S16}} = \frac{xI_B I_{S25}}{I_{S16}}. \tag{22}$$

and $$I_2 = I_{S20}\exp\left(\frac{V_{BE25}}{V_{TH}}\right) = I_B\frac{I_{S20}}{I_{S25}} = \frac{xI_B I_{S16}}{I_{S25}}. \tag{23}$$

Substituting equation (4), which defines $m=(I_S(NPN))/(I_S(PNP))$, leads to the equations $$I_1 = x\frac{I_B}{m} \tag{24}$$

and $$I_2 = xI_B m \tag{25}$$

If we compare equations (23) and (24) with equations (19) and (20), respectively, it is apparent that the only difference is that the bias current $I_B$ is scaled by the factor x. This means that the bias current source can be kept at a low level, thus minimizing the power dissipation of the complementary current mirror.

The diamond follower circuit often is used as a line driver. FIG. 3 shows another common use of a diamond follower. In FIG. 3, the diamond follower circuit of FIG. 1 is biased by the complementary current mirror circuit of FIG. 2 to provide $I_1$ and $I_2$, with bias control circuitry 21 supplying the bias current $I_B$ to the complementary current mirror control transistors 16 and 25. The collector 6A of transistor 6 is connected by a resistor 33, which may be 1200 ohms, to $+V_S$ and also is connected directly to the base of a PNP pullup transistor contained in output stage 32. The collector 8A of transistor 8 is connected by a resistor 34, which may be 1200 ohms, to $-V_S$ and also is connected to the base of an NPN pulldown transistor in output stage 32. Details of the bias circuit 21 and the operation of the PNP current mirror circuit connecting output stage 32 to $+V_S$ and the NPN current mirror circuit connecting output stage 32 to $-V_S$ are described in detail in commonly assigned co-pending application "WIDE-BAND AMPLIFIER WITH CURRENT MIRROR FEEDBACK TO BIAS CIRCUIT", Ser. No. 223,796, filed on July 25, 1988, by Anthony D. Wang and R. M. Stitt II, and incorporated herein by reference. Of course, the diamond follower circuit with the complementary current sources as shown in FIG. 3 can be used in conjunction with conventional techniques for limiting the current in the output transistors, rather than the current mirror feedback structure shown in FIG. 3.

Thus, the output of the bias control circuitry $I_B$ causes the NPN/PNP current mirrors 10 and 11 to provide the appropriate bias currents to force the $+V_{IN}$ and $-V_{IN}$ conductors to the same potential. Also, the current $I_0$ in transistors 6 and 8 is controllably scaled to $I_B$. Often, current scaling can easily be accomplished, where advantageous, by controlling the area ratios of transistors 16 and 15 and of transistors 25 and 20.

The circuit shown in FIG. 3 can be modified, if desired, to include a diode-connected NPN or PNP transistor or other voltage source, rather than a short circuit between the base of transistor 16 and $V_S$. The emitter of the diode-connected transistor can be connected to the base of transistor 16 and the base and collector can be connected to $+V_S$. Similarly, a diode-connected NPN or PNP transistor can replace the short circuit between the base of transistor 25 and $-V_S$. In this case, the emitter of the diode-connected PNP transistor is connected to the base of transistor 25 and the collector and base thereof are connected to $-V_S$. Such diode-connected transistors minimize base width modulation of transistors 16 and 25 to cause them to more closely match the operating conditions of the transistors 7 and 5, respectively, neither of which operates with zero collector-to-base bias voltage. Any voltage drop between the collector and base of transistors 16 and 25, such as results from adding the above-mentioned diode-connected transistors, increases the current which transistors 16 and 25 can carry before they go into saturation due to internal resistive voltage drops. Also, degeneration resistors can be connected in series with the emitters of transistors 15, 16, 5, 6, 7, 8, 20, and 25 to temper the exponential variation of bias currents from the complementary NPN/PNP current mirrors when the saturation currents of the NPN transistors and the PNP transistors differ from each other. Use of the degeneration resistors does not reduce the input offset voltage quite as effectively as the circuit shown in FIG. 3, but reduces bias current variation in transistors 5 and 7, which is desirable because the frequency responses of transistors 5 and 7 are somewhat dependent on their emitter currents, and a sufficient bias current difference will cause distortion in the frequency of response of the amplifier.

The above-described circuit technique, using a complementary current mirror to generate the current necessary to match $V_{BE}$ voltages of dissimilar transistors or the like, allows the designer of wide-band voltage buffers and transimpedance amplifiers to come one step closer to the ideal of zero offset voltage without requiring tighter control of integrated circuit manufacturing processes to equalize PNP and NPN saturation currents. The above circuit techniques decrease the processing complexity, since no attention need be paid to trying to target $I_S$(NPN) and $I_S$(PNP) to be equal or nearly equal. The described circuit techniques also increase manufacturing yields since the input offset voltage will no longer be subject to the variation that could eliminate entire wafers within a processed lot or even eliminate a number of wafer lots.

It should be noted that the present invention is not limited to just use of a diamond follower stage. There are likely to be many situations wherein it would be desirable to achieve control of "mixed device" terminal currents and voltages. Nor is it necessary that the transistors be bipolar. The concepts explained above will work if the NPN transistors and PNP transistors are replaced with N channel MOSFETS and P channel MOSFETS, respectively, as shown in the schematic diagram of FIG. 4, which shows a MOSFET implementation of the circuit of FIG. 3. The "body" electrodes of the MOSFETs should be connected to their source electrodes to avoid body-to-source voltage difference from increasing the MOS threshold voltages. This could be accomplished if dielectrically isolated (DI) substrates are used. In FIG. 4, the currents $I_B$ and $I_1$ are given by the equations $$I_B = k_N(V_{GS16A} - V_{TN})^2 \tag{26}$$

and $$I_1 = k_P(V_{GS15A} - V_{TP})^2. \tag{27}$$

Equation (26) leads to $$V_{GS16A} = \sqrt{\frac{I_B}{k_N}} + V_{TN} \tag{28}$$

Equation (27) leads to $$I_1 = (\sqrt{k_P}\, V_{GS15A} - \sqrt{k_P}\, V_{TP})^2. \tag{29}$$

Since $$V_{GS16A} = V_{GS15A} = \sqrt{\frac{I_B}{k_N}} + V_{TN}, \text{ this}$$

this leads to $$I_1 = \left[\left(\sqrt{\frac{k_p}{k_N}}\right)(\sqrt{I_B}\,) + (\sqrt{k_p}\,)(V_{TN} - V_{TP})\right]^2, \text{ where} \tag{30}$$

$$k_N = \left(\frac{\mu_n C_{OX}}{2}\right)\left(\frac{W}{L}\right) \text{ and } k_p = \left(\frac{\mu_p C_{OX}}{2}\right)\left(\frac{W}{L}\right)$$

where $\mu_n$ and $\mu_p$ are the n channel and p channel mobilities, respectively, W/L is the channel width-to-length ratio of the MOSFET under consideration, $V_{TN}$ and $V_{TP}$ are the p channel and n channel MOSFET threshold voltages, respectively, and $C_{OX}$ is the normalized gate capacitance of the MOSFET under consideration. Equation (30) gives a value of $I_1$ that is related to the "parametric" difference between the P channel and N channel threshold voltages, and may be useful for compensating characteristics other than $V_{OS}$ for various CMOS circuits other than diamond followers for variations in one or both of these threshold voltages.

The offset voltage of the diamond follower circuit can be adjusted in ways other than using complementary mirror circuits in the manner described above. For example, $I_1$ and $I_2$ can be varied by trimming conventional current sources. $I_1$ and $I_2$ could be produced by any of a variety of controlled current source circuits that uses a complementary current mirror to generate a control signal. Alternately, feedback from the output of an amplifier might be used to adjust the bias currents fed into bias input terminals 23 and 24.

By way of definition, a base, emitter, and collector of a transistor can be regarded as its control electrode, first current carrying electrode, and second current carrying electrode, respectively. The gate, source, and drain of a MOSFET can be regarded as its control electrode, first current carrying electrode, and second current carrying electrode, respectively.

While the invention has been described with reference to a particular embodiment thereof, those skilled in the art will be able to make various modifications to the described embodiment without departing from the true spirit and scope of the invention.

What is claimed is:

1. A method for producing zero offset voltage in a diamond follower circuit including first and second bias input terminals, an input terminal and an output terminal, the method comprising the steps of:
   (a) producing a first NPN $V_{BE}$ voltage;
   (b) imposing the first NPN $V_{BE}$ voltage between a base and an emitter of a first PNP transistor to produce a first bias current;
   (c) using the first bias current to equalize $V_{BE}$ voltages of a first pair of opposite conductivity type transistors one transistor of the first pair having a base coupled to the input terminal and an emitter coupled to the first bias input terminal, another transistor of the first pair having an emitter coupled to the output terminal and a base coupled to the first bias input terminal;
   (d) producing a first PNP $V_{BE}$ voltage;
   (e) imposing the first PNP $V_{BE}$ voltage between a base and an emitter of a first NPN transistor to produce a second bias current;
   (f) using the second bias current to equalize $V_{BE}$ voltages of a second pair of opposite conductivity type transistors, one transistor of the second pair having a base coupled to the input terminal and an emitter coupled to the second bias input terminal, another transistor of the second pair having an emitter coupled to the output terminal and a base coupled to the second bias input terminal, whereby the voltage between the input terminal and the output terminal is zero.

2. The method of claim 1 including causing a control current to flow through a second NPN transistor and a second PNP transistor, respectively.

3. The method of claim 2 wherein the first pair of opposite conductivity transistors includes a third PNP transistor and a third NPN transistor, and wherein step (c) includes causing the first bias current to flow through the third PNP transistor to produce a second PNP $V_{BE}$ voltage, and wherein the second pair of opposite conductivity transistors includes a fourth NPN transistor and a fourth PNP transistor, and wherein step (f) includes causing the second bias current to flow through the fourth NPN transistor to produce a second NPN $V_{BE}$ voltage, and imposing the sum of the second PNP $V_{BE}$ voltage and the second NPN $V_{BE}$ voltage between the base of the third NPN transistor and the base of the fourth PNP transistor.

4. A zero offset amplifier, comprising in combination:
   (a) first and second differential input terminals;
   (b) first and second bias input terminals;
   (c) first and second differential output terminals;
   (d) a PNP first transistor having an emitter coupled to the first bias input terminal, a collector coupled to a first supply voltage conductor, and a base coupled to the first differential input terminal;
   (e) an NPN second transistor having an emitter coupled to the second bias input terminal, a collector coupled to a second supply voltage conductor, and a base coupled to the first differential input terminal;
   (f) an NPN third transistor having a base coupled to the first bias input terminal, an emitter coupled to the second differential input terminal, and a collector coupled to the first differential output terminal;
   (g) a PNP fourth transistor having a base coupled to the second bias input terminal, an emitter coupled to the second differential input terminal, and a collector coupled to the second differential output terminal;
   (h) a bias current control circuit having a bias current sink terminal and a bias current source terminal;
   (i) a first complementary current mirror including
      i. an NPN fifth transistor having a collector and base coupled to the second supply voltage conductor and an emitter coupled to the bias current sink terminal,
      ii. a PNP sixth transistor having an emitter coupled to the second supply voltage conductor, a base coupled to the bias current sink terminal, and a collector coupled to the first bias input terminal, the NPN fifth transistor and the PNP sixth transistor coacting to produce a first bias current that compensates the PNP first transistor for any difference in the normalized saturation currents of the PNP first transistor and the NPN third transistor;
   (j) a second complementary current mirror including
      i. a PNP seventh transistor having a base and collector coupled to the first supply voltage conductor and an emitter coupled to the bias source terminal,
      ii. an NPN eighth transistor having an emitter coupled to the first supply voltage conductor, a base coupled to the bias current source terminal, and a collector coupled to the second bias input terminal, the PNP seventh transistor and the NPN eighth transistor coacting to produce a second bias current that compensates the NPN second transistor for any difference in the normalized saturation currents of the NPN second transistor and the PNP fourth transistor.

5. The zero offset amplifier of claim 4 including a first load device coupled between the first differential output terminal and the second supply voltage conductor, and a second load device coupled between the second differential output terminal and the first supply voltage conductor.

6. The zero offset amplifier of claim 5 wherein the PNP first transistor has a normalized saturation current which is substantially different than that of the NPN second transistor.

7. The zero offset amplifier of claim 5 wherein the first load device is a first resistor and the second load device is a second resistor.

8. A method of producing a current which represents an inequality between a parameter of a first PNP transistor and a first NPN transistor, comprising the steps of:

(a) forcing a control current through the first PNP transistor to generate a first $V_{BE}$ voltage;

(b) applying the first $V_{BE}$ voltage between the base and emitter of the first NPN transistor to cause a controlled current to flow in the first NPN transistor, the controlled current including a first component which is proportional to the control current and a second component which is related to the inequality, wherein the inequality is represented by a ratio of the normalized saturation currents of the first PNP transistor and the first NPN transistor, respectively;

(c) forcing the controlled current through a second NPN transistor which has the same normalized saturation current as the first NPN transistor to produce a second $V_{BE}$ voltage which is compensated for the difference between the normalized saturation currents of the first PNP transistor and the first NPN transistor and applying the second $V_{BE}$ voltage between the base and emitter of a second PNP transistor which has the same normalized saturation current as the first PNP transistor to produce a current in the second PNP transistor which is substantially unaffected by the difference between the normalized saturation currents.

9. A method of producing a current which represents an inequality between a parameter of a first NPN transistor and a first PNP transistor, comprising the steps of:

(a) forcing a control current through the first NPN transistor to generate a first $V_{BE}$ voltage;

(b) applying the first $V_{BE}$ voltage between the base and emitter of the first PNP transistor to cause a controlled current to flow in the first PNP transistor, the controlled current including a first component which is proportional to the control current and a second component which is related to the inequality, wherein the inequality is represented by a ratio of the normalized saturation currents of the first NPN transistor and the first PNP transistor, respectively;

(c) forcing the controlled current through a second PNP transistor which has the same normalized saturation current as the first PNP transistor to produce a second $V_{BE}$ voltage which is compensated for the difference between the normalized saturation currents of the first PNP transistor and the first NPN transistor and applying the second $V_{BE}$ voltage between the base and emitter of a second NPN transistor which has the same normalized saturation current as the first NPN transistor to produce a current in the second NPN transistor which is substantially unaffected by the difference between the normalized saturation currents.

10. A method of producing a current which represents an inequality between a parameter of a first MOSFET of a first channel type and a second MOSFET of a second channel type, comprising the steps of:

(a) forcing a control current through a source electrode of the first MOSFET to generate a first gate-to-source voltage;

(b) applying the first gate-to-source voltage between gate electrode and a source electrode of the second MOSFET to cause a controlled current to flow in the second MOSFET, the controlled current including a first component which is proportional to the control current and a second component which is related to the inequality.

11. A method of adjusting an offset voltage of a diamond follower circuit including first and second bias input terminals, first and second differential input terminals and first and second differential output terminals, a PNP first transistor having an emitter coupled to the first bias input terminal, a collector coupled to a first supply voltage conductor, and a base coupled to the first differential input terminal, an NPN second transistor having an emitter coupled to the second bias input terminal, a collector coupled to a second supply voltage conductor, and a base coupled to the first differential input terminal, an NPN third transistor having a base coupled to the first bias input terminal, an emitter coupled to the second differential input terminal, and a collector coupled to the first differential output terminal, a PNP fourth transistor having a base coupled to the second bias input terminal, an emitter coupled to the second differential input terminal, and a collector coupled to the second differential output terminal, the method comprising the steps of:

(a) supplying a first bias current to the first bias input terminal;

(b) sinking a second bias current from the second bias input terminal;

(c) adjusting the first bias current to equalize a $V_{BE}$ voltage of the PNP first transistor and the NPN third transistor, and adjusting the second bias current to equalize a $V_{BE}$ voltage of the NPN second transistor and the PNP fourth transistor.

12. A method for producing zero offset voltage in a diamond follower circuit including first and second bias input terminals, an input terminal and an output terminal, the method comprising the steps of:

(a) producing a first N channel MOSFET $V_{GS}$ voltage;

(b) imposing the first N channel MOSFET $V_{GS}$ voltage between a gate and an source of a first P channel MOSFET to produce a first bias current;

(c) using the first bias current to equalize $V_{GS}$ voltages of a first pair of opposite conductivity type MOSFETs, one MOSFET of the first pair having a gate coupled to the input terminal and a source coupled to the first bias input terminal, another MOSFET of the first pair having an source coupled to the output terminal and a gate coupled to the first bias input terminal;

(d) producing a first P channel MOSFET $V_{GS}$ voltage;

(e) imposing the first P channel MOSFET $V_{GS}$ voltage between a gate and a source of a first N channel MOSFET to produce a second bias current;

(f) using the second bias current to equalize $V_{GS}$ voltages of a second pair of opposite conductivity type MOSFETs, one MOSFET of the second pair having a gate coupled to the input terminal and a source coupled to the second bias input terminal, another MOSFET of the second pair having a source coupled to the output terminal and a gate coupled to the second bias input terminal, whereby the voltage between the input terminal and the output terminal is zero.

13. A zero offset amplifier, comprising in combination:

(a) first and second differential input terminals;

(b) first and second bias input terminals;

(c) first and second differential output terminals;

(d) a P channel first MOSFET having a source coupled to the first bias input terminal, a drain coupled to a first supply voltage conductor, and a gate coupled to the first differential input terminal;

(e) an N channel second MOSFET having a source coupled to the second bias input terminal, a drain coupled to a second supply voltage conductor, and a gate coupled to the first differential input terminal;

(f) an N channel third MOSFET having a gate coupled to the first bias input terminal, a source coupled to the second differential input terminal, and a drain coupled to the first differential output terminal;

(g) a P channel fourth MOSFET having a gate coupled to the second bias input terminal, a source coupled to the second differential input terminal, and a drain coupled to the second differential output terminal;

(h) a bias current control circuit having a bias current sink terminal and a bias current source terminal;

(i) a first complementary current mirror including
 i. a N channel fifth MOSFET having a drain and gate coupled to the second supply voltage conductor and a source coupled to the bias current sink terminal,
 ii. a P channel sixth MOSFET having a source coupled to the second supply voltage conductor, a gate coupled to the bias current sink terminal, and a drain coupled to the first bias input terminal, the N channel fifth MOSFET and the P channel sixth MOSFET coacting to produce a first bias current that compensates the P channel first MOSFET for any difference in the normalized saturation currents of the P channel first MOSFET and the N channel third MOSFET;

(j) a second complementary current mirror including
 i. a P channel seventh MOSFET having a gate and drain coupled to the first supply voltage conductor and a source coupled to the bias current source terminal,
 ii. an N channel eight MOSFET having a source coupled to the first supply voltage conductor, a gate coupled to the bias current source terminal, and a drain coupled to the second bias input terminal, the P channel seventh MOSFET and the N channel eighth MOSFET coacting to produce a second bias current that compensates the N channel second MOSFET for any difference in the normalized saturation currents of the N channel second MOSFET and the P channel fourth MOSFET.

14. A complementary current mirror, comprising in combination:
(a) an input terminal for conducting a control current;
(b) an output terminal for conducting a controlled current;
(c) a supply voltage conductor;
(d) a control field effect transistor having a source electrode connected to the input terminal and conducting the control current, and a gate electrode and a drain electrode both connected to the supply voltage conductor;
(e) an output field effect transistor having a source electrode connected to the supply voltage conductor, a gate electrode connected to the input terminal, and a drain electrode connected to the output terminal, the output transistor and the input transistor being of opposite conductivity types, the control field effect transistor and the output field effect transistor coacting to produce the controlled current in the drain electrode of the output field effect transistor so that the controlled current is representative of both the control current and a parametric difference between the control field effect transistor and the output field effect transistor.

15. The complementary current mirror of claim 14 wherein the control transistor is an enhancement mode N channel field effect transistor and the output transistor is an enhancement mode P channel field effect transistor.

16. The complementary current mirror of claim 14 wherein the control transistor is an enhancement mode P channel field effect transistor and the output transistor is an enhancement mode N channel field effect transistor.

17. A method of adjusting an offset voltage of a diamond follower circuit including first and second bias input terminals, first and second differential input terminals and first and second differential output terminals, a P channel first MOSFET having a source coupled to the first bias input terminal, a drain coupled to a first supply voltage conductor, and a gate coupled to the first differential input terminal, an N channel second MOSFET having a source coupled to the second bias input terminal, a drain coupled to a second supply voltage conductor, and a gate coupled to the first differential input terminal, an N channel third MOSFET having a gate coupled to the first bias input terminal, a source coupled to the second differential input terminal, and a drain coupled to the first differential output terminal, a P channel fourth MOSFET having a gate coupled to the second bias input terminal, a source coupled to the second differential input terminal, and a drain coupled to the second differential output terminal, the method comprising the steps of:
(a) supplying a first bias current to the first bias input terminal;
(b) sinking a second bias current from the second bias input terminal;
(c) adjusting the first bias current to equalize a $V_{GS}$ voltage of the P channel first MOSFET and the N channel third MOSFET, and adjusting the second bias current to equalize a $V_{GS}$ voltage of the N channel second MOSFET and the P channel fourth MOSFET.

* * * * *